(12) United States Patent
Pearce et al.

(10) Patent No.: US 9,171,991 B2
(45) Date of Patent: Oct. 27, 2015

(54) FLEXIBLE SOLAR CELL INTERCONNECTION SYSTEMS AND METHODS

(75) Inventors: David Pearce, Saratoga, CA (US);
Bruce Hachtmann, San Martin, CA (US); Arthur Wall, Morgan Hill, CA (US); Thomas Valeri, Gilroy, CA (US); Dennis Hollars, San Jose, CA (US)

(73) Assignee: Dow Global Technologies LLC

( * ) Notice: Subject to any disclaimer, the term of this patent is extended or adjusted under 35 U.S.C. 154(b) by 92 days.

(21) Appl. No.: 13/581,808

(22) PCT Filed: Mar. 10, 2011

(86) PCT No.: PCT/US2011/027815
§ 371 (c)(1),
(2), (4) Date: Aug. 30, 2012

(87) PCT Pub. No.: WO2011/112765
PCT Pub. Date: Sep. 15, 2011

(65) Prior Publication Data
US 2012/0318331 A1 Dec. 20, 2012

Related U.S. Application Data

(60) Provisional application No. 61/312,620, filed on Mar. 10, 2010.

(51) Int. Cl.
*H01L 31/18* (2006.01)
*H01L 31/0392* (2006.01)
*H01L 31/05* (2014.01)
*H01L 31/046* (2014.01)
*H01L 31/049* (2014.01)
*H02S 40/36* (2014.01)
*H01L 31/0445* (2014.01)
*H01L 31/042* (2014.01)

(52) U.S. Cl.
CPC ........ *H01L 31/188* (2013.01); *H01L 31/03928* (2013.01); *H01L 31/046* (2014.12); *H01L 31/049* (2014.12); *H01L 31/0445* (2014.12); *H01L 31/0504* (2013.01); *H02S 40/36* (2014.12); *Y02E 10/541* (2013.01); *Y10T 29/41* (2015.01)

(58) Field of Classification Search
USPC .......... 438/62, 64, 66, 80, 110, 118, 124, 128
See application file for complete search history.

(56) References Cited

U.S. PATENT DOCUMENTS

| | | | |
|---|---|---|---|
| 4,260,429 A | 4/1981 | Moyer | |
| 4,283,591 A | 8/1981 | Boer | |
| 5,084,107 A * | 1/1992 | Deguchi et al. | ............... 136/256 |
| 5,474,622 A | 12/1995 | Negami et al. | |
| 6,472,594 B1 | 10/2002 | Ichinose et al. | |
| 7,829,781 B2 | 11/2010 | Montello et al. | |

(Continued)

FOREIGN PATENT DOCUMENTS

| DE | 10109643 A1 | 12/2002 |
|---|---|---|
| WO | 2009097161 A1 | 8/2009 |

*Primary Examiner* — Jonathan Johnson
*Assistant Examiner* — Bethany L Martin

(57) ABSTRACT

Disclosed is a highly automated method of interconnecting flexible solar cells to form solar modules having a wide variety of sizes and electrical characteristics. The method is fast and economical, providing many attributes of a "pseudo monolithic integration" scheme that has previously been attainable only on rigid substrates.

13 Claims, 7 Drawing Sheets

(56) References Cited

U.S. PATENT DOCUMENTS

| | | |
|---|---|---|
| 8,319,097 B2 | 11/2012 | Luch |
| 8,383,929 B2 * | 2/2013 | Milshtein et al. ............. 136/251 |
| 2002/0139415 A1 * | 10/2002 | Shimizu et al. ............... 136/256 |
| 2006/0157103 A1 * | 7/2006 | Sheats et al. ................. 136/244 |
| 2007/0207560 A1 * | 9/2007 | LeCain et al. ................... 438/22 |
| 2007/0251566 A1 * | 11/2007 | Ouchida et al. ............... 136/244 |
| 2008/0196756 A1 * | 8/2008 | Basol ............................ 136/244 |
| 2009/0266399 A1 * | 10/2009 | Basol et al. .................... 136/244 |
| 2010/0059099 A1 * | 3/2010 | Arai .............................. 136/244 |
| 2010/0170556 A1 * | 7/2010 | Frolov et al. .................. 136/244 |

* cited by examiner

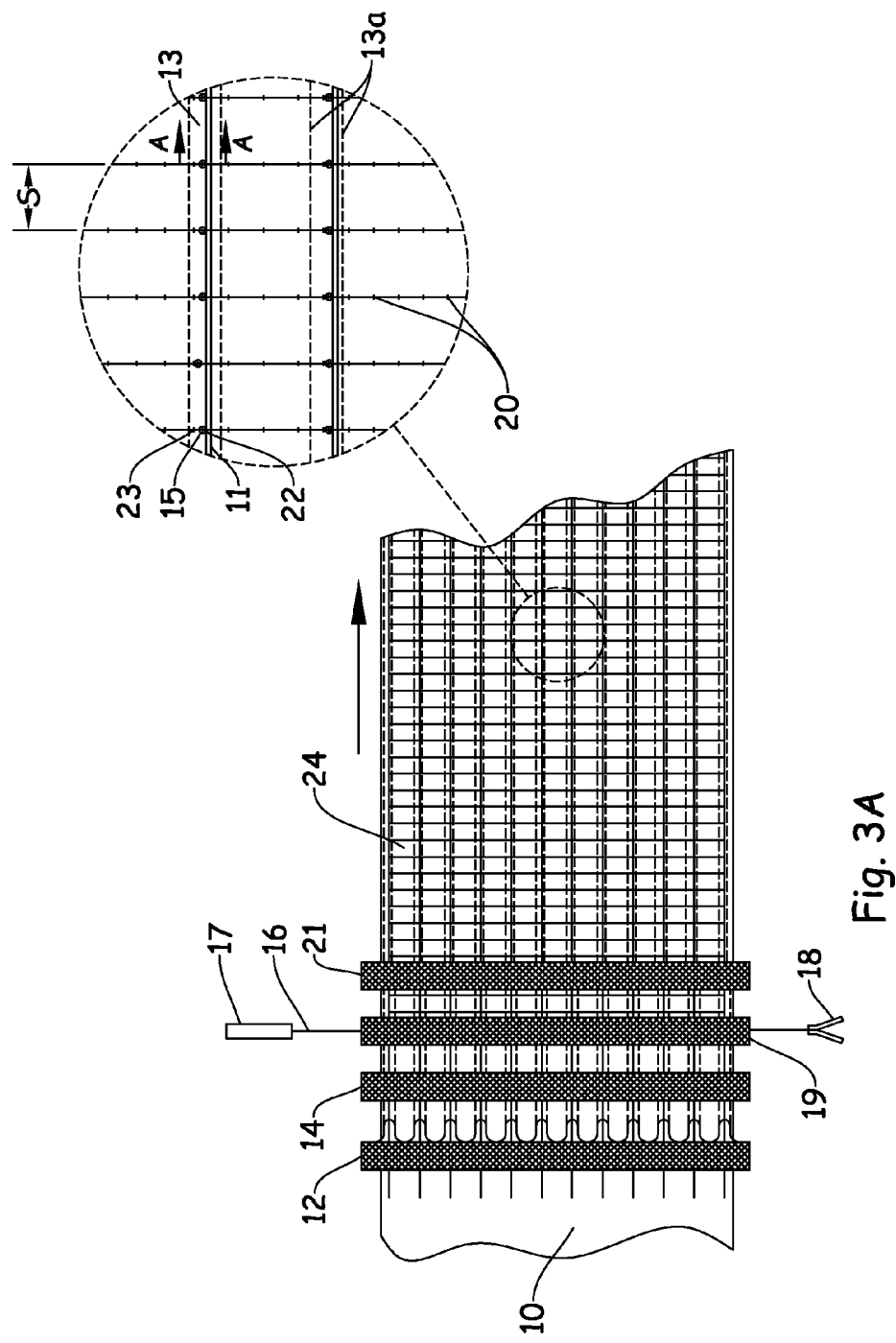

FLEXIBLE SOLAR CELL INTERCONNECTION SYSTEMS AND METHODS

CROSS REFERENCE TO RELATED APPLICATIONS

This application is a 35 USC §371 national phase filing of PCT/US2011/027815 filed Mar. 10, 2011, which claims the benefit of U.S. Application No. 61/312,620, filed Mar. 10, 2010.

This application claims benefit from U.S. Provisional Patent Application No. 61/312,620, filed Mar. 10, 2010, the entire contents of both of which are hereby incorporated herein by reference. This invention relates generally to the field of the electrical interconnection of solar cells to form a solar module, and more specifically to thin film solar cells formed on flexible substrates. The invention discloses automated methods for interconnecting flexible solar cells.

BACKGROUND OF THE INVENTION

Thin film solar cells on flexible substrates are today limited to amorphous silicon on a thin metal foil (usually stainless steel) and copper indium gallium diselenide (CIGS) on metal or polyimide foils. Undoubtedly, there will be other types of solar cell materials suitable for use on flexible substrates available at some time in the future. Thin film cadmium telluride solar cells are currently produced only on glass. To be useful in a solar power system, any type of solar cell must be electrically interconnected serially with other similar solar cells to raise the voltage levels and minimize $I^2R$ losses due to high currents. Cells deposited on rigid sheets of glass generally use a system of scribes applied between different process steps and at specific locations to interconnect the cells over the entire sheet. This procedure is called "monolithic integration". Such a method is difficult to implement on flexible substrates because of the accuracy required for both the placement and depth of the scribes. Additionally, flexible substrates enable roll-to-roll processing which can become less desirable economically if the process is interrupted to implement the scribing operations even if they could be readily done.

Traditional crystalline or polycrystalline silicon solar cells are formed on individual wafers, which then must be interconnected. Current collecting grids and buss bars are usually formed by screen-printing a pattern with silver bearing inks that are subsequently cured at high temperatures (on the order of 700° C.). The traditional grid pattern consists of a series of fine straight and parallel lines spaced a few millimeters apart with two or three wider lines (buss bars) running perpendicular to the pattern of fine lines. The resulting structure provides a surface on the buss bars to which interconnecting tabs can be attached by conventional soldering methods. The cell current is collected by the relatively narrow grids and transmitted to the relatively wider buss bars which then become the connection points to the next cell. An advantage of this method over monolithic integration is that the cells can be tested and sorted for performance prior to module build. In this way the module performance is not limited by the lowest performing cell in the string.

The same method applied to thin film flexible solar cells has met with only limited success. At least two problems are generally encountered. First, the thin film cells cannot survive the high temperatures needed to adequately cure the silver inks. As a result of lower curing temperatures some of the ink carriers and solvents remain in the grid line structure, which lowers the conductivity and severely limits the solderability of the printed buss bars. Alternatively, the interconnection may be made with conductive epoxies, but the method is mechanically and electrically inferior to soldering. Secondly, since the surface finish of useful flexible substrates is much rougher than that of glass or silicon wafers, many more defects exist which can become shunt sites if conductive ink is allowed to flow into them. This problem can be somewhat mitigated by first printing a much less conductive material, like a carbon ink to initially fill the defects, and then over printing with the silver ink. Consistently good results are very difficult to achieve, since anything short of perfect registration causes extra shading loss as well as increased potential shunting. In addition the cost of the materials and equipment is relatively high.

U.S. Pat. No. 5,474,622, which is entirely incorporated herein by reference, teaches using metallic wires as grids, but with the wires coated with carbon fibers of sufficient length to avoid being forced into defects. In this method the wires were attached to the top electrode (transparent conductive oxide or TCO) of the thin film amorphous silicon solar cells during the process of laminating them into modules. In effect the previous art of printing a carbon based ink pattern first is replaced with carbon fibers that have much less chance of causing shunts in film/substrate defects and at the same time provide a fusing type of protection against sustained heavy shunt currents. The wire size and spacing must be selected so as to carry the current generated by the cell without generating significant resistive losses.

U.S. Pat. Nos. 4,260,429 and 4,283,591, which are entirely incorporated herein by reference, teach coating conductive wires with a polymer that contained conducting particles. Problems with defect-induced shunts could still exist because of smaller conductive particles in the distribution, and improvements were put forth in U.S. Pat. No. 6,472,594, which is entirely incorporated herein by reference.

Regardless of the detailed way in which the possible shunt paths are dealt with when applying the conductive grids to flexible solar cells, no comprehensive, automated, and economical interconnection scheme has been developed for flexible solar cells which possesses many of the automated features of monolithic integration on rigid glass. It is the purpose of the present invention to present an improved interconnect scheme which might be referred to as "pseudo monolithic integration" suitable for automated implementation for flexible solar cells.

SUMMARY OF THE INVENTION

In an aspect of the invention, improved methods for interconnecting flexible solar cells are provided. The improved methods include automation features. In an embodiment, the automation features are similar to those of monolithic integration.

In another aspect of the invention, methods for interconnecting flexible solar cells are provided that are very economical in comparison to less automated conventional methods.

In various embodiments of the invention, improved methods for interconnecting flexible thin film solar cell materials are provided. In embodiments, the methods can be used to form sheet(s) from which integrated strings may be cut to create modules of different sizes.

In one aspect, the present invention relates to a method preferably interconnecting solar cells and/or for forming sheets comprising thin film solar cell material comprising the steps of:

a) providing a plurality of continuous strips of solar cell material each comprising a flexible substrate, a conductive back contact region, a photoactive region, and a transparent conductive region;

b) transferring the continuous strips of solar cell material to a continuous backing sheet such that the flexible substrate contacts the backing sheet and a gap is formed between adjacent strips;

c) applying an insulating material over a predetermined region of the edge of each of the strips on each side of the gap, said insulating material contacting at least a portion of the backing sheet on each side of the gap;

d) forming a plurality of bonding pads on one end of each of the strips disposed on one side of the gap by selectively removing a portion of the insulating material and the photoactive region to expose a portion of the back contact region;

e) providing a plurality of electrically conductive wires in contact with the bonding pads of the plurality of strips of solar cell material and the transparent conductive region;

f) forming an electrical bond between the plurality of electrically conductive wires and each of the bonding pads; and g) cutting the wires on one side of each of the bonding pads to form cut regions, In another aspect, the present invention relates to a processing system for forming interconnected solar cells having strips of solar cell material, the system comprising:

(a) a cutting module configured to slit a roll or sheet of flexible solar cell material into strips of solar cell material;

(b) an abrasive module downstream from the cutting module, the abrasive module configured to treat one or more edges of each of the strips;

(c) an electrical testing module downstream of the abrasive module, the electrical testing module configured to continuously test the electrical properties of the strips;

(d) a non-conducting material application module downstream from the electrical testing module, the non-conducting material application module configured to continuously fill a gap between adjacent strips with transparent insulating material;

(e) a bonding pad application module downstream from the non-conducting material application module, the bonding pad application module configured to form a plurality of bonding pads on an edge portion of each of the strips; and (f) a wire application module downstream from the bonding pad application module, the wire application module configured to provide an electrically conductive wire across the plurality of bonding pads of the strips.

In yet another aspect, the present invention relates to a photovoltaic article comprising:

a) continuous strips of solar cell material each comprising a flexible substrate, a conductive back contact region, a photoactive region and a transparent conductive region;

b) a continuous backing sheet configured such that the flexible substrate contacts the backing sheet and a gap is formed between adjacent strips;

c) insulating material contacting both edges of each of the strips on each side of the gap and at least a portion of the backing sheet on each side of the gap;

d) a plurality of bonding pads on one end of each of the strips disposed on one side of the gap, wherein the bonding pads are formed by selective removal of a portion of the insulating material and the photoactive region to expose a portion of the back contact region;

e) a plurality of electrically conductive wires in electrical contact with the bonding pads of the plurality of strips of solar cell material and the transparent conductive region;

f) cut regions formed on one side of each of the bonding pads comprising adjacent ends of separated electrically conductive wires and insulating material in contact with both the bonding pads and the adjacent ends of separated electrically conductive wires.

In yet another embodiment, the method comprises a) slitting thin film solar cell material into continuous strips of a predetermined width either from a roll or directly and continuously from the deposition system;

b) continuously buffing each edge of each strip to remove any shunting material left by the slitting operation (in one embodiment continuously removing a small area of solar cell material alone one edge of each strip);

c) continuously testing the photoelectric performance of the material along each strip;

d) continuously laminating a series of strips to a backing sheet with a small space between the strips;

e) applying and curing a bead of transparent electrically insulating material to the small space between strips;

f) removing a small amount of solar cell material and insulating material in discrete spots alone one edge of each strip to form bonding pads;

g) dispensing a fine conductive grid wire across the series of strips and bonding the wire to the substrate (or back electrode) at the discrete sites where the solar cell material was removed;

h) attaching the wire in a predetermined pattern across the top (transparent conductive oxide, or TCO) electrode of each cell.

i) cutting the wire between the wire bonding pad and the next cell, and dispensing a small amount of curable polymer to form an insulating barrier;

j) repeating the process for the next grid wire at a predetermined spacing;

k) cutting the interconnected cell material into strings of suitable width for various module designs;

l) assembling the strings into module patterns of predetermined size; and m) laminating a transparent flexible top sheet over the strings to hold the conducting wires in firm contact to the cell top electrode.

INCORPORATION BY REFERENCE

All publications, patents, and patent applications mentioned in this specification are herein incorporated by reference to the same extent as if each individual publication, patent, or patent application was specifically and individually indicated to be incorporated by reference.

BRIEF DESCRIPTION OF THE DRAWINGS

The novel features of the invention are set forth with particularity in the appended claims. A better understanding of the features and advantages of the present invention will be obtained by reference to the following detailed description that sets forth illustrative embodiments, in which the principles of the invention are utilized, and the accompanying drawings of which:

FIG. 3A is a schematic view of a plurality of strips being laminated to a back sheet and interconnected via welding or soldering with details provided in an expanded view, in accordance with an embodiment of the invention;

DETAILED DESCRIPTION OF THE INVENTION

Various advantages of the invention will be appreciated and understood when considered in conjunction with the following description and accompanying drawings. While the following description may contain specific details describing particular embodiments of the invention, this should not be construed as limitations to the scope of the invention but rather as an exemplification of preferable embodiments. For each aspect and embodiment of the invention, many variations are possible as suggested herein that are known to those of ordinary skill in the art. A variety of changes and modifications can be made within the scope of the invention without departing from the spirit thereof Reference will now be made to the figures, wherein like numerals refer to like parts throughout. It will be appreciated that the figures are not necessarily drawn to scale.

Figure 1:
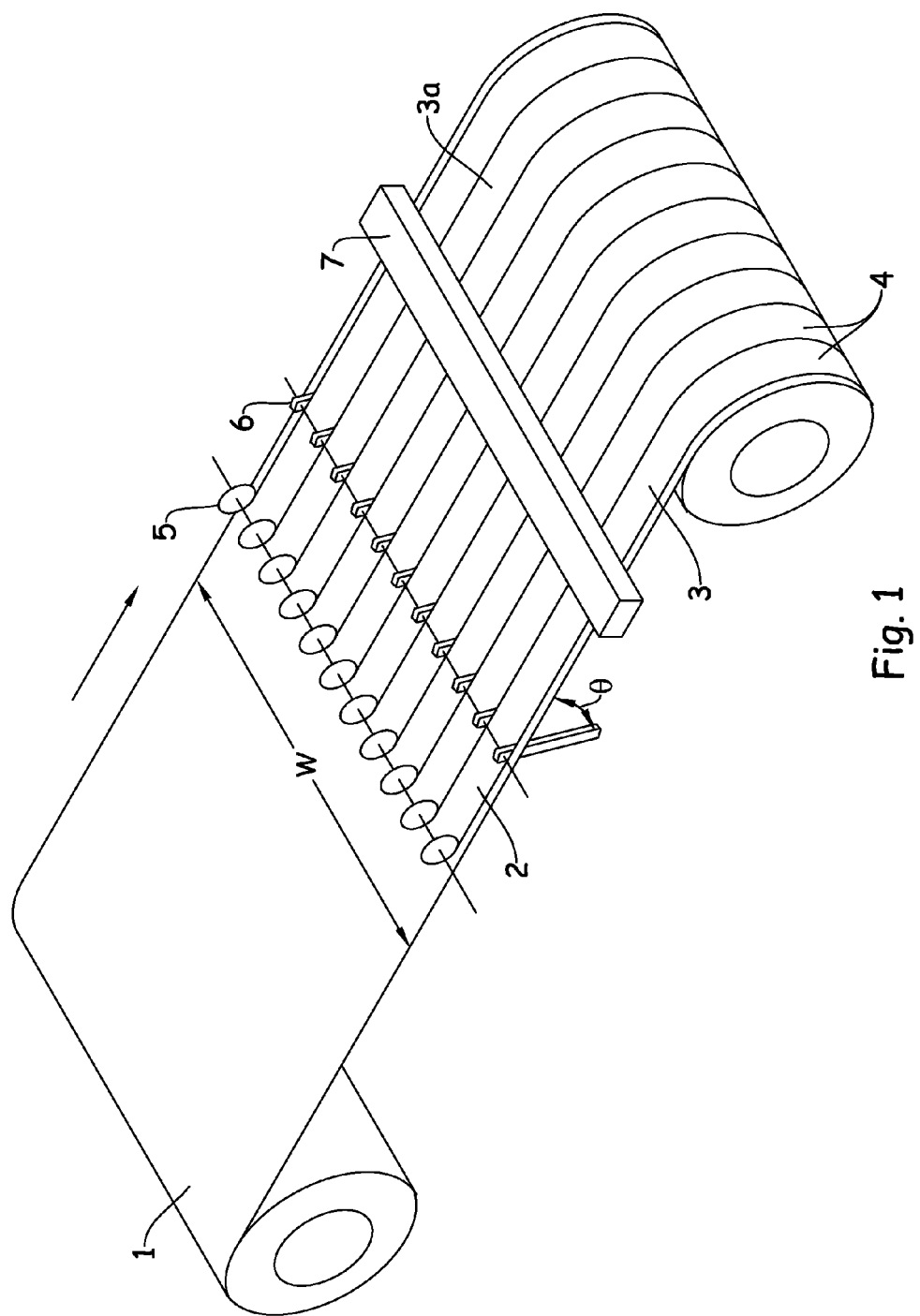
FIG. 1 is a schematic diagram which shows the slitting of a roll (or continuous sheet) of solar cell material into individual strips which are edge treated and tested to form reels of solar cell material with uniform properties, in accordance with an embodiment of the invention.

FIG. 1 shows a schematic top/side perspective view illustrating the automated continuous slitting and processing of large areas of flexible solar cell material into individual strips of a predetermined size. The solar cell material generally comprises a flexible substrate, a conductive back contact region on the top surface of the substrate, a photoactive region comprising one or more layers deposited on the back contact region and a transparent conductive region deposited on the photoactive region. The flexible substrate may be comprised of anon-conductive material, typically a polymeric material such as polyimide or a conductive material. Exemplary conductive substrates include metal foils such as stainless steel or aluminum or titanium foil. A back contact region exists on the surface of the substrate. The back contact region is typically a conductive metal such as molybdenum, copper, tungsten or tantalum, however, in cases where a conductive substrate is used, the back contact region may be the top surface of said substrate. In other cases where a conductive substrate is used, an additional back contact region (typically Mo), may be applied to the top surface of the substrate. The photoactive region is deposited on the back contact region and comprises a thin film absorber material that converts solar energy into electrical energy. Examples include CIGS, CdTe, GaAs, amorphous silicon and the like. The photoactive region also includes additional layers that facilitate the effective conversion of solar energy, including buffer layers and window layers. In an illustrative embodiment, the photoactive region comprises a CIGS absorber layer, a CdS buffer layer and an intrinsic ZnO window layer. The transparent conductive region exists on the top of the photoactive region. Exemplary materials for the transparent conductive region include transparent conductive oxides such as indium tin oxide or aluminum zinc oxide.

In the illustrated embodiment, for simplicity, the input 1 of finished flexible solar cell material is shown as a roll, and is indicated as having sufficient width, 'W', to accommodate a plurality of individual strips 2. In other embodiments, the source material is not required to be in roll form, but could come straight from the equipment performing the final step in cell production, or it may be input as a series of individual sheets of some convenient length. Processing proceeds in the direction of the indicated arrow. Additionally, processed strips 3 can be fed to the next processing zone or station without being first rolled into individual reels 4 as illustrated in FIG. 1 for convenience. However, depending upon the requirements of the downstream processing steps, handling the strips in reel form could be desirable or even necessary. For purposes of discussion or illustration, the thin-film solar cell material is considered to have been deposited on the side of the substrate which is on the outside of the indicated roll (on top in the figure), but the solar cell material could be deposited on either side of the roll.

In an embodiment, processing begins by using a cutting module having a series of knives 5 (for instance rotary knives) or other cutting devices (or cutting members) in order to produce a plurality of strips 2. The cut edges of the solar cell strips can have defects from the slitting operation that leaves small amounts conductive material or particles bridged across the p-n junction. These may cause some electrical shorting (or shunting) at various places along the edges of the cell that can be detrimental to the performance of the solar cell. To ensure that this is not the case, in an embodiment, an abrasive module having abrasive members is used to treat one or more edges of each of the strips to remove any material, such as residual material that may cause electrical shorting between the strips. In an embodiment, a series of very thin abrasive blades 6 are positioned so as to abrade each edge of each strip. Positioning the abrasive blades at an angle θ of less than 90 degrees with respect to the plane of the cells, as indicated, helps ensure that abrasion starts on the cell deposition side (i.e., top) of the substrate and proceeds toward the back. This relative motion between the cell and the blade tends to bend the coated top side of the cell downward, creating a slight angle which favors abrasion at the cell's coated edge. A vacuuming device or system (not shown) can be used to remove loose particles from the strips that are created by the abrasion. This eliminates any material that might be causing a short across the p-n junction in the cell.

With continued reference to FIG. 1, after the edges of the cell strips are cleaned and freed of any electrical shunts, the strips pass to an electrical testing module and under an electrical testing means or device indicated as element 7. Here the short circuit current and the open circuit voltage are continuously recorded for an area of limited extent, such as an area defined by an illuminated opening. This recorded history of cell performance can be used to optimize the construction of the solar module. Strips of tested cells may be passed to the next processing station on reels 4, or they can feed directly into the next station without first being rolled up. In either case it is advantageous to do a sort on the cell performance data between the testing station and the reel rolling station. It is not shown in detail in the drawing, but 3a indicates a step where under-performing material (i.e., material that does not meet predetermined performance requirements) may be cut out of the strip and the strip spliced back together. In its most elegant embodiment, this cut and splice operation can be used to produce complete reels of material graded into appropriate bins for later lamination into modules. For this operation reels 4 would not be mounted rigidly along a common axis as suggested in the drawing. Rather, the reels could be offset from each other (for example, alternately up and down using appropriate rollers) and could be interchanged during the cut-and-splice operation. In this manner any particular reel could accumulate cell material that tested within a narrow range of performance, such material being derived from any of the strips depending on the test data.

Figure 2:
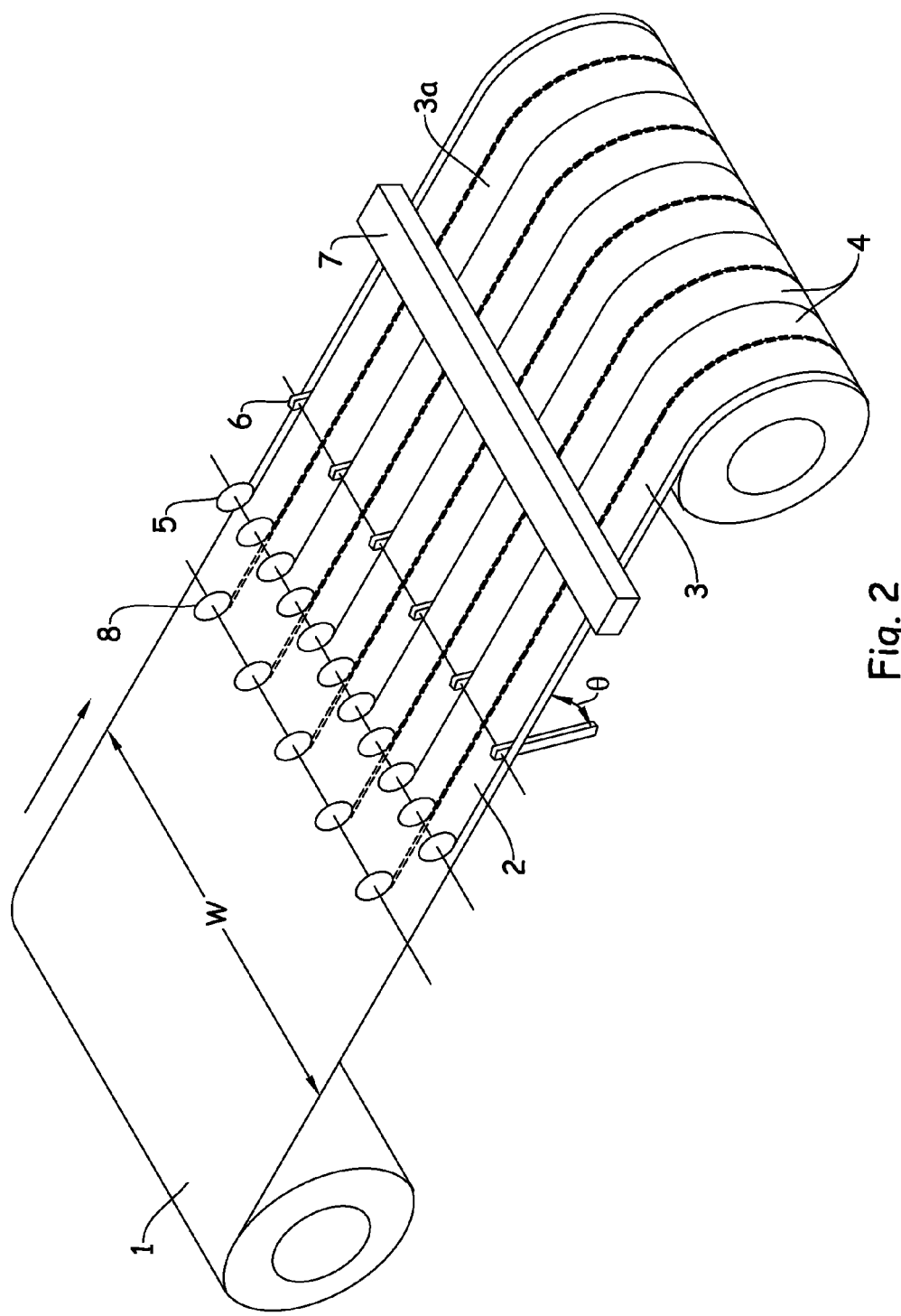
FIG. 2 is a schematic diagram illustrating an alternative method for forming strips of solar cell material where a narrow band of material is automatically removed from one edge of each strip, in accordance with an embodiment of the invention.

FIG. 2 indicates an alternative slitting device and process. The alternative slitting device includes a set of abrasive wheels 8 configured to remove a narrow line of cell material at every other slitting position. The width of this line of removed material can be of the order of a few tens of mils (also "milli-inch" herein). In certain embodiments, the width of this line of removed material can be between about 0.021" and 0.080". The slitting device produces the strips of cell material as previously described with the cut coming in the middle of the abraded lines created by wheels 8. The edges of the strip of cells are cleaned of shunt sites by abrasive blades 6, except now only every other blade is needed since the abrasive wheels 8 have already performed this function in the region of cell material removal. This operation produces strips of solar cell material each of which has a narrow region of material removed along one of its edges. The strips are more conveniently rolled onto reels 4 to feed the next station, since the edge with removed material needs to be oriented in the same sense. That is, every other reel needs to be flipped around. The material may be graded in a cut-and-splice operation to again produce reels with uniform performance, as described above.

In an embodiment, the strips of cells that are created as shown in FIG. 1 can next fed to an assembly station as depicted in FIG. 3A for further processing. Processing proceeds in the direction indicated by the arrow either continuously or in discrete steps. In this instance, the strips of cells need not have been rolled into reels 4, but could alternately be fed directly into the station from the previous one. However, the module efficiencies can be optimized by using reels of material of the same grade as described by operation 3a. Regardless of the manner in which strips of cells are introduced, strips of cells 3 are laminated (i.e., adhered) to a backing sheet 10 with a small predetermined gap 11 (expanded view) left between each strip. Backing sheet 10 may include, for example, a thin membrane of a polymeric material, such as, e.g., polyethylene terephthalate (PET), which carries a thin layer of thermoplastic adhesive that is dispensed from a roll. Other backing sheet materials can be used as well, and they need not be transparent since they are behind the active cell material. If metal foil substrates are used, they must adequately be insulated electrically from the back electrode of the cells or the backing sheet must be insulating to avoid shorting the cells together. The purpose of backing sheet 10 is to hold the strips of cells securely positioned with respect to each other with a small gap 11 between the strips. The strips of cells need to be as close together as possible to minimize light loss, but they cannot touch and short together electrically (i.e., the strips of cells should preferably be electrically isolated from one another). If the flexible substrate is a magnetic material, it is possible to eliminate the backing sheet and perform the interconnect operation using a magnetic table to hold the strips in place. In this case the strips of cells should have a transparent insulating material pre-coated along each edge and cured to prevent accidental shorting. Other details would also change with respect to the general example discussed below, but would be apparent to those skilled in the art. It will be appreciated that the drawing is not drawn to scale, and details along gap 11 are exaggerated with respect to the width of the strip.

With continued reference to FIG. 3A, after the strips of cells are attached (e.g. laminated) to the backing sheet, in a non-conducting material application module, non-conducting material application means (or member) 12 applies a thin narrow layer 13 of a non-conducting (or non-conductive) material over at least a portion of the region of gap 11. In embodiments, this material should be transparent to the solar flux and be quickly curable. In an embodiment, the non-conducting material is a dielectric material. In another embodiment, the non-conducting material is an electrically insulating (also "insulating" herein) material. For example, the material can be curable with the aid of ultraviolet (UV) light or a low level of heating, such as could be applied with a low power laser. In an embodiment, the material is a transparent non-conducting (or insulating) polymer. In another embodiment, the material is a dielectric material, such as a dielectric adhesive. In some embodiments, the dielectric material can include Edge Protection Sealant (#0812) manufactured by Bekaert which can cure in air in several seconds. In the magnified view of FIG. 3A, the thin layer of non-conducting material (adhesive) 13 is indicated as being bounded (or defined) by dashed lines 13a. Since the material is transparent, there is some discretion as to the exact width of the application. It should cover at least a portion of the backing sheet region in gap 11 and a predetermined region of the edge of each of the strips on each side of the gap to prevent the strips from touching or shorting together with further handling, and it should provide a protective and insulating region for subsequent cell bonding operations. Preferably, according to one embodiment it fills the gap. In an embodiment, the width of the non-conducting material (the width of the region defined by the dashed lines 13a) can be between about 1 millimeter to several millimeters, such as 10 millimeters.

Next, with continued reference to FIG. 3A, in a bonding pad application module, bonding pad application means or member 14 creates a small bonding pad area 15 along one edge of each strip. This can be accomplished with a small rotary end mill type of cutter or a small abrasive disk or other similar tool. The diameter might typically be on the order of a few tens of mils. Miniature carbide end mills are readily available in diameters ranging from 5 to 60 mils, while 1/64" and 1/32" mills are standard in normal tool steels. Alternatively, the bonding pad region can be formed via the use of a laser. The use of a laser provides the advantage of much better control of the dimensions of the bonding pad region and may also reduce the amount of debris formed in that region that could cause shorting (or shunting) of the solar cell material. Note that the pad is shown placed slightly off the edge of the cell to form a path cleared of cell material along the edge of the cell. This is more for convenience than necessity. The pad (and the wire cut site, see below) may be placed anywhere within the broader side of area 13. The range of positioning is illustrated in the figure by elements 15a and 23a.

Next, after the bonding pads are formed, in a wire application module, an electrically conducting (or conductive) wire, 16, is fed from spool 17 (or other wire application member) across the rows of solar cell strips over the bonding pads and is held and tensioned by schematic clamp 18. Wire 16 could be made from several materials, but a plated copper wire is preferred due to preferable electrical conductivity and cost and availability. For desirable sizes of solar cells with common grid spacing, the wire diameter would advantageously fall in the range of 3 to 6 mils, however a broad range of wire diameters or thicknesses can be used for this application. Only one dispense wire is shown in the figure, but a plurality of wire dispense stations can be used. Next, transparent adhesive material application means (or member) 19 applies a series of transparent adhesive drops 20 to wire 16 and rapidly cures the drops to hold the wire (or wires) in place. After it is secured in place, the two ends of the wire are cut to the width of the sheet. The sheet advances to welding or soldering means (or member) 21 where multiple welding or soldering heads attaches the wire to bonding pads 15 at predetermined locations 22, indicated by X's in the expanded view of FIG. 3A. Care must be taken to insure that the weld or solder spot does not encroach on the side walls of the cell material around the bonding pad where it would create an electrical shorting path. Just after the wire is joined to the bonding pad, a series of small knives, or a laser, cuts the wires adjacent to the bonding positions, 23, and a small drop of clear adhesive (such as non-conducting material 13) is applied to both the bonded and the cut area and cured to insure no shorting or reconnect of the wire occurs. This completes the interconnection of the cells along the dispensed wire. The process can be repeated at a pre-selected spacing 'S' to create a continuous sheet of interconnected solar cells 24.

Figure 3B:
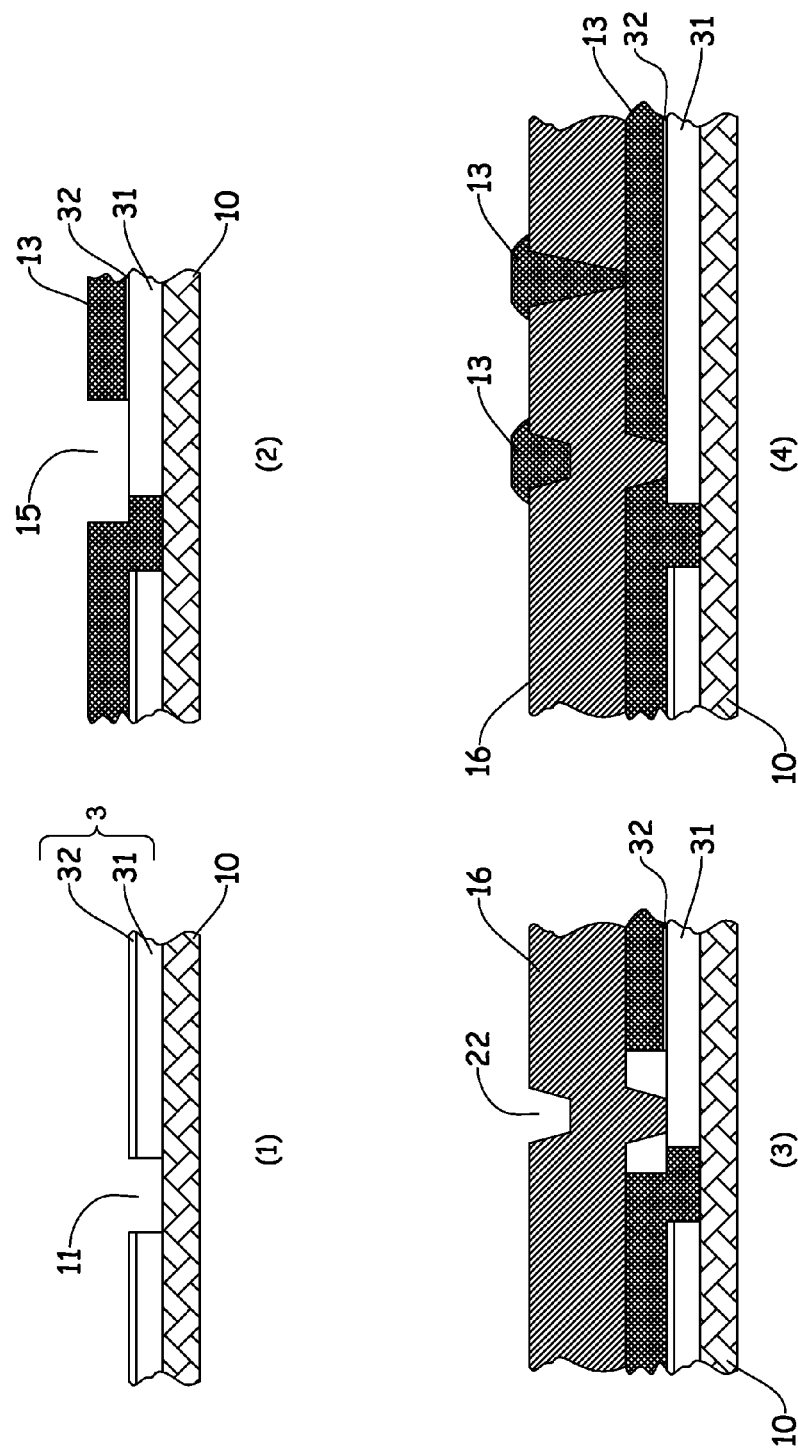
FIG. 3B is a cross-sectional sequential representation of the details of cell interconnection, in accordance with an embodiment of the invention.

FIG. 3B illustrates the progression (layer-by-layer formation) of interconnect steps at the cell-to-cell boundary cross section (A-A in FIG. 3A) as a sequence of four drawings labeled (1) through (4), in accordance with an embodiment of the invention. It will be appreciated that FIG. 3B and the drawings are not to scale, the thickness dimension (vertical) being greatly exaggerated with respect to the length (horizontal) dimension. With reference to FIG. 3B, drawing (1) shows a portion of backing sheet 10 with small gap 11 separating two strips of cells 3. Here, the two major parts of the strips are indicated as the substrate 31 (for example, a metal foil, such as a stainless steel foil or aluminum or tantalum foil) and the active solar cell stack 32, such as a CIGS or CdTe solar cell stack. In drawing (2), the non-conducting material 13 has been applied to the interconnect region and cured, and bonding pad 15 has been formed. Non-conducting material 13 also fills the gap 11. In the illustrated embodiment, in pad area 15 the active solar cell material 32 has been removed down to substrate 31 (a metal foil in this case), and the pad extends slightly into gap region 11 as previously described in FIG. 3A. In the case where the flexible substrate is a non-conductive substrate, the active solar cell material 32 can be removed down to the back contact region applied onto the flexible substrate. In drawing (3), wire 16 is provided (e.g., stretched) across the cells, and a weld or solder connection 22 is made between wire 16 and substrate 31. Connection 22 is illustrated very schematically. At true scale pad 15 is many times wider than substrate 3a is thick, so that wire 16 is actually pushed down in the center of the pad to make the contact. Care must be taken in this step to ensure that wire 16 is not allowed to come in contact with cell material 32 at any position within the pad. Drawing (4) shows wire 16 being cut at position 23 (see FIG. 3A) and both the cut region and the pad/bonded area is filled with transparent non-conducting material 13 and cured. This keeps the elements from shorting during subsequent handling.

Figure 4:
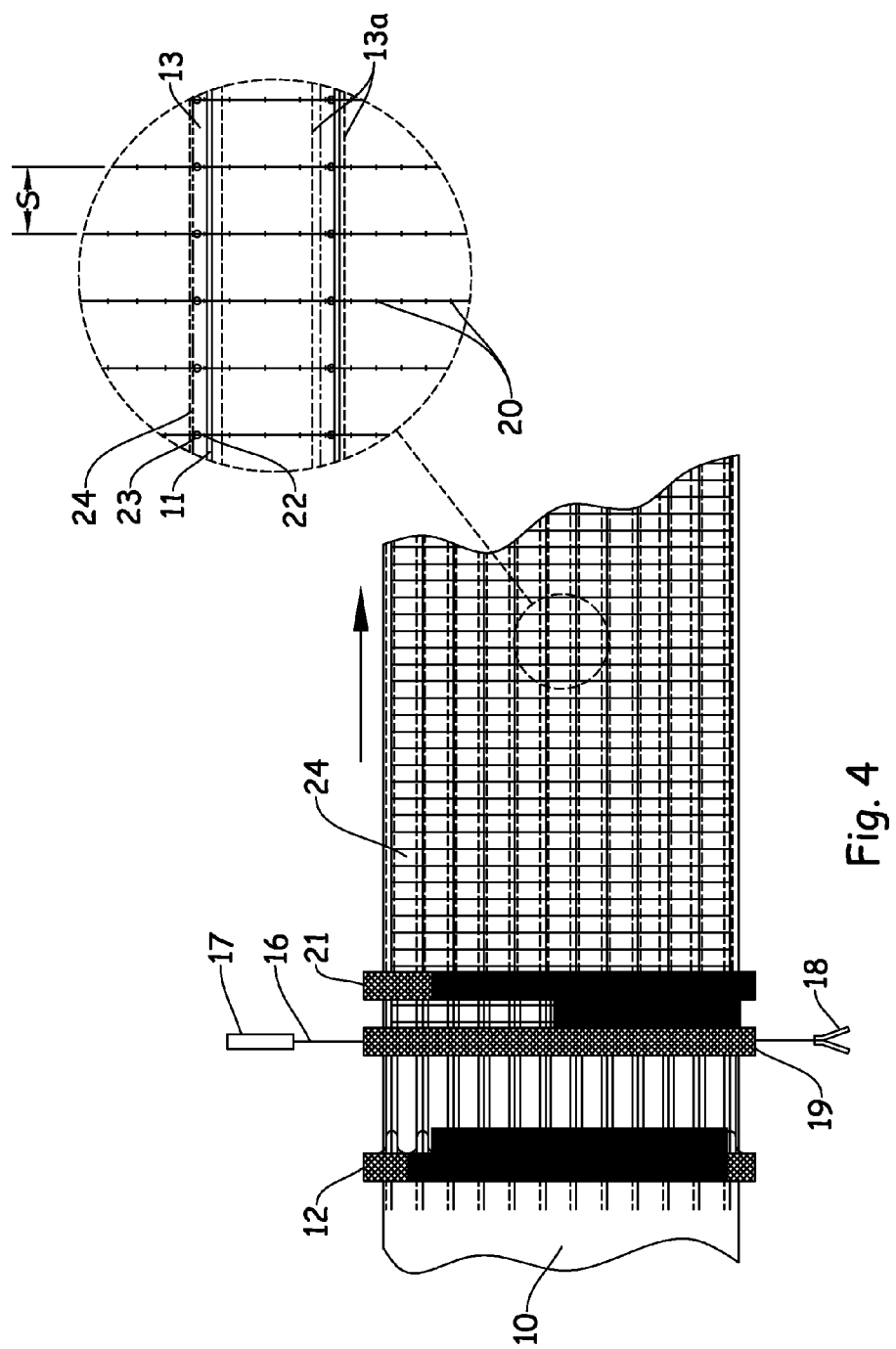
FIG. 4 is a schematic view of an alternative method to that described in FIG. 3A, in accordance with an embodiment of the invention.

With reference to FIG. 4, in an embodiment, an alternative method of cell interconnection when the original sheet is processed as described in FIG. 2 is shown. Elements common to those in FIG. 3A are similarly labeled. As previously mentioned, alternate reels 4 shown in FIG. 2 must be flipped around to correctly orient the strips for lamination onto the backing sheet. This results in a narrow line along one edge of each strip that is cleaned of solar cell material to expose an area as a continuous bonding region, i.e., a continuous pad. In FIG. 4, this region is represented by the area between line 24 and gap 11 in the expanded view. The processing is the same as in the previous example except a discrete pad is not exposed. Rather, the welding or soldering connection 22 is made through the narrow layer of cured dielectric (or non-conducting) material. The advantage to this method is that it eliminates the need for high accuracy in the placement of the wire over the small bonding pad, but at a cost of removing about 1% to 2% of the area of the cell that otherwise could be collecting light and generating power. For this reason, in at least some cases the method of FIG. 3A might be preferable, even though greater accuracy in placement is required.

Figure 5:
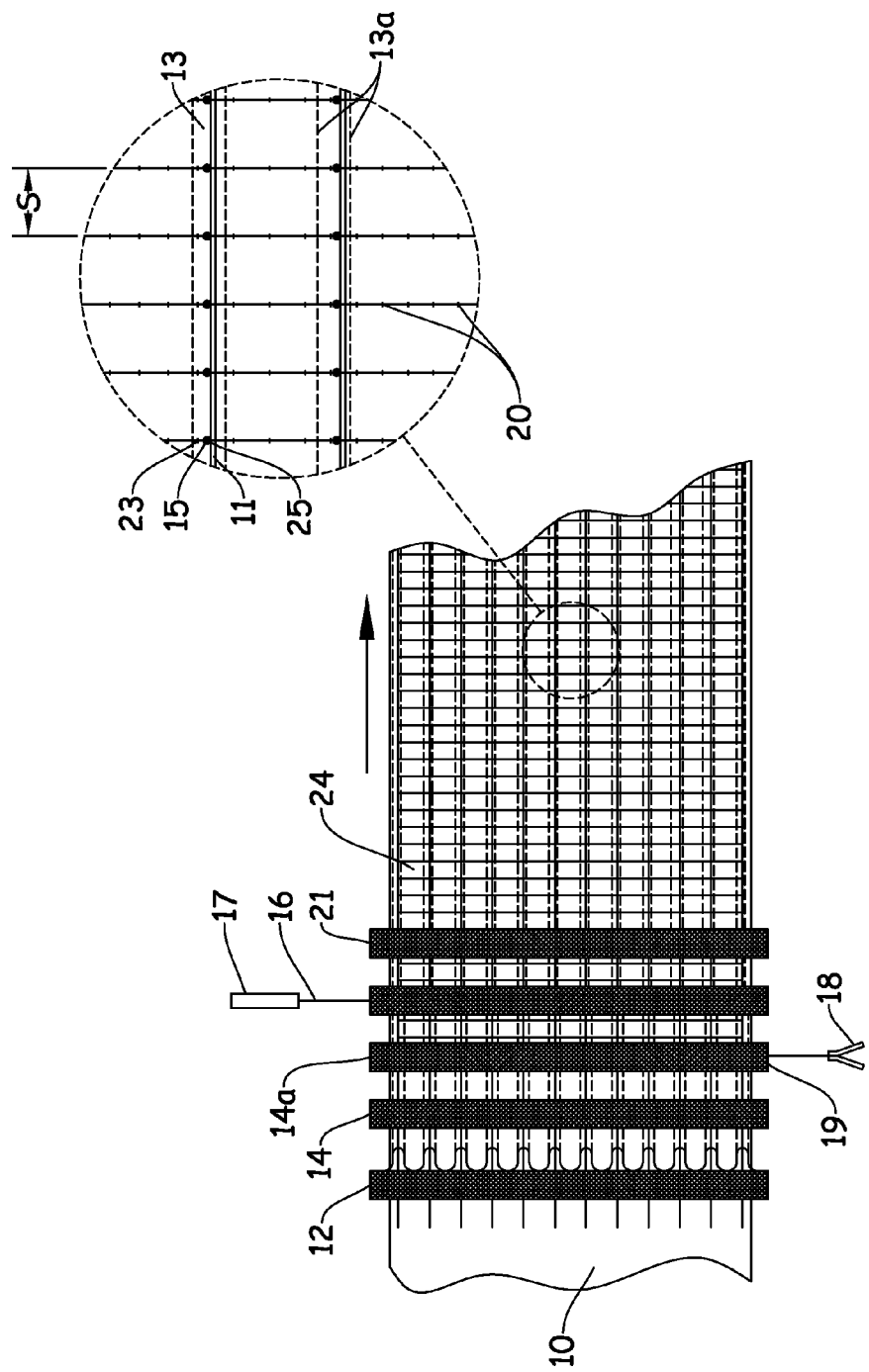
FIG. 5 is a schematic view of another alternative method of interconnection suitable for using conductive adhesives in lieu of welding or soldering, in accordance with an embodiment of the invention.

Another alternate method is illustrated in FIG. 5. In this method another step is added to allow for the use of conductive adhesives, for example silver filled epoxy, to make the interconnection. This is an alternative to using welding or soldering for forming interconnects between cells. Otherwise the method is the same as that described for FIG. 3A. An additional bonding pad application means (or member) 14a is shown in FIG. 5. Means 14 makes a similar bonding pad as described previously, but the area is immediately filled with an insulating adhesive and quickly cured. In the next step means 14a makes a slightly smaller bonding pad accurately centered on the first. In the expanded view, this is indicated by 25. The sizes of the pads are subject to some discretion depending on the accuracy capability of the equipment; however, the idea is to create a smaller pad within a larger pad and to provide an insulating cover over the side walls of the cell material that was exposed in making the first pad.

The more accurate the equipment, the smaller can be the feature, resulting in less light loss and improved solar cell performance and efficiency. However, the open pad 25 should not be small compared to the diameter of the wire 16. For example if the wire 16 has a diameter of about 0.005 inches, then the diameter of the pad 25 should be a few times larger, such as between about 2 and 10 times larger, or between about 4 and 6 times larger. In an embodiment, an acceptable range might be between about 0.020 and 0.030 inches. Rather than welding or soldering, means 21 now dispenses and cures a small drop of conductive adhesive over wire 16, which also fills the area of pad 25. Since conductive adhesives are not as low in resistance as pure metals, the extra contact area on the wire and in the pad (compared to welding) lowers the total resistance of the contact enough to be acceptable and indeed comparable in performance to the welding or soldering operations. The construction of the "double pad" with the insulating side walls keeps the conductive adhesive from causing a short across the solar cell junction. Wire 16 is still cut at locations 23 and insulated as previously described.

Figure 6:
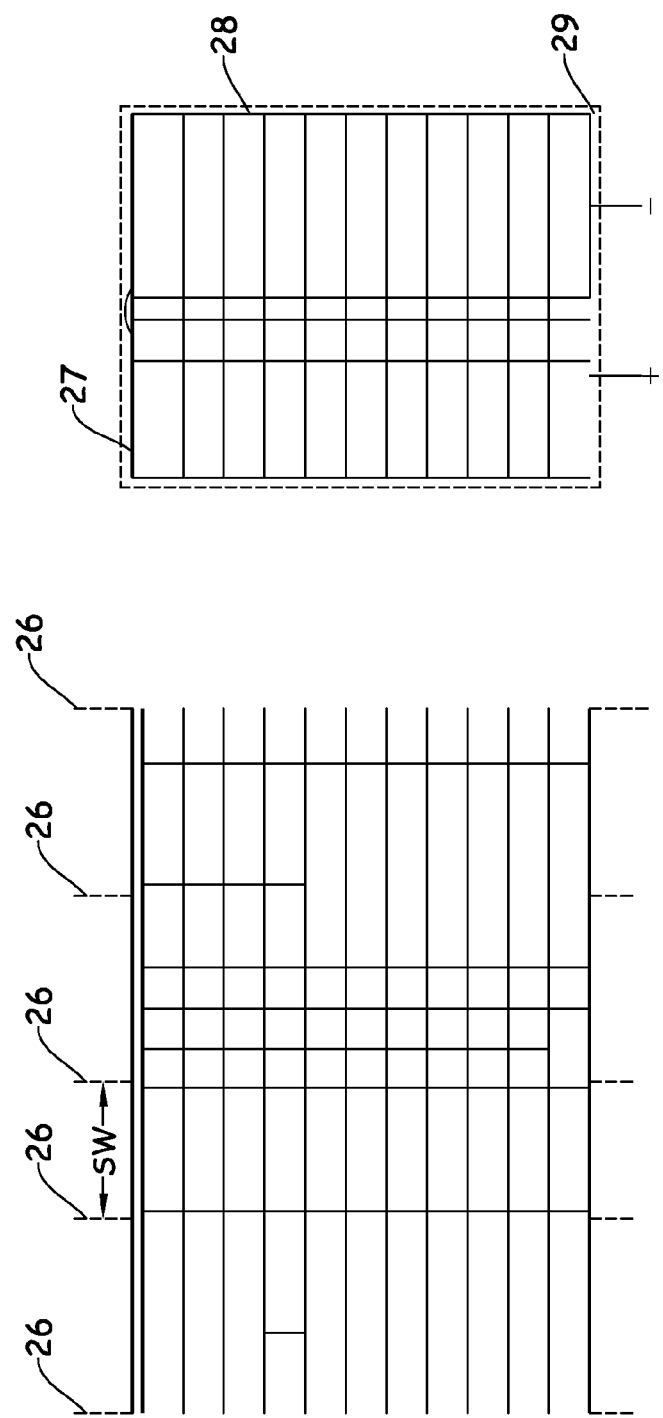
FIG. 6 is a schematic illustration showing an example of how interconnected cells can be cut into strings and assembled into modules, in accordance with an embodiment of the invention.

With reference to FIG. 6, in an embodiment of the invention, the principle of cutting up a continuous sheet of interconnected cells 24 into individual strings of interconnected cells is illustrated. Cuts 26 are made at predetermined string widths (SW), and the cuts run parallel to and between wires 16. After buss bars 27 are added to each end of each string, two strings can be inverted with respect to each other and connected on one end to make a basic module 28. A transparent and flexible top sheet 29 is then laminated over the module. This performs two functions. First, it seals the top sheet to the back sheet and provides more mechanical strength for handling. Second, it pushes the wires against the top electrode of the cells to make good electrical contact. In a preferable embodiment, the electrical contact between the top electrode and the cells is such that electron recapture by the solar cell is minimized, thereby aiding in optimal device performance.

This interconnect scheme allows a large amount of flexibility in both module size and electrical characteristics. As an example, module 28 can have its voltage doubled (but same total area and shape) by using 4 serially connected strings each with a width of SW/2. Alternately, a double size module can be made using 4 strings of width SW and the voltage would also be doubled if they are connected serially. If even larger modules were desired, without having a voltage increase, an appropriate array of sub-modules could be connected in parallel. Thus, by using a single continuous sheet setup, a very broad range of modules can be designed having different sizes and electrical characteristics. With a change in the slit width of the cell material and a change in the width and number of the interconnected reels of material, numerous modules could be made.

In various embodiments, a control system is provided for controlling (or automating) the formation of sheets comprising thin film solar cell material. The control system can be configured to control the progression of the solar cell material in a roll-to-roll process, in addition to the non-conducting material application member, the bonding pad application members, the transparent adhesive material application members, the welding or soldering member, and the electrical testing member or device. For example, the control system can control the rate at which the solar cell material is fed or directed to various modules of various embodiments of the invention. As another example, the control system can control the point and manner in which bonding pad application member 14 creates the bonding pad area 15. The control system can also control various vacuum equipment and robotics equipment for moving components between processing systems or modules.

While preferable embodiments of the present invention have been shown and described herein, it will be obvious to those skilled in the art that such embodiments are provided by way of example only. Numerous variations, changes, and substitutions will now occur to those skilled in the art without departing from the invention. It should be understood that various alternatives to the embodiments of the invention described herein may be employed in practicing the invention. It is intended that the following claims define the scope of the invention and that methods and structures within the scope of these claims and their equivalents be covered thereby.

What is claimed is:

1. A method for making sheets of interconnected solar cells, comprising:
   a) providing a plurality of continuous strips of solar cell material each comprising a flexible substrate, a conductive back contact region, a photoactive region, and a transparent conductive region;
   b) adhering the continuous strips of solar cell material to a continuous backing sheet such that the flexible substrate contacts the backing sheet and a gap is formed between adjacent strips;
   c) applying an insulating material over a predetermined region of the edge of each of the strips on each side of the gap, said insulating material contacting a region of the top surface of the strips of solar cell and at least a portion of the backing sheet on each side of the gap;
   d) forming a plurality of bonding pads on one end of each of the strips disposed on one side of the gap by selectively removing a portion of the insulating material and the photoactive region to expose a portion of the back contact region;
   e) providing at least one electrically conductive wire across the plurality of continuous strips of solar cell material such that the at least one electrically conductive wire is in electrical contact with the bonding pads of the plurality of strips of solar cell material and the transparent conductive region and;
   f) cutting the at least one electrically conductive wire on one side of each of the bonding pads to form cut regions.

2. The method of claim 1, further comprising a step of applying an insulating material to the bonding pads and cut regions after the step of cutting the wires.

3. The method of claim 1, further comprising a step of curing the insulating material after it is applied to the strips.

4. The method of claim 1, wherein the insulating material is a transparent insulating material.

5. The method of claim 1, wherein the step of providing at least one electrically conductive wire comprises providing more than one electrically conductive wire further comprising cutting the sheets of interconnected solar cell material in regions between a portion of said electrically conductive wires to form solar cell strings of predetermined width.

6. The method of claim 1, further comprising a step of attaching the at least one electrically conductive wire to terminal bars at each end of the sheets of interconnected solar cells for connecting to external circuitry.

7. The method of claim 1, further comprising a step of providing a top transparent flexible sheet over the sheets of interconnected solar cells and laminating said top transparent flexible sheet.

8. The method of claim 1, further comprising the step of slitting a relatively wide roll or long sheet of flexible solar cell material into the plurality of strips of solar cell material.

9. The method of claim 8, further comprising a step of treating one or more of the edges of the plurality of strips of solar cell material after the slitting step to remove defects and debris.

10. The method of claim 8, further comprising rolling the strips of solar cell material onto a reel following the slitting step.

11. The method of claim 1, further comprising a step of testing the electrical properties along each of the continuous strips of solar cell material.

12. The method of claim 11, wherein the continuous strips of solar cell material are categorized according to their electrical properties prior to the step of transferring continuous strips of solar cell material to a continuous backing sheet.

13. The method of claim 1 wherein the at least one electrically conductive wire has a diameter and the bonding pad has a size is from 2 to 10 times the diameter of the at least one electrically conductive wire.

* * * * *